United States Patent [19]

Rieser et al.

[11] Patent Number: 5,450,018
[45] Date of Patent: Sep. 12, 1995

[54] DEVICE FOR TESTING ELECTRICAL MODULES

[75] Inventors: Hansjorg Rieser, Elgg; Peter Schmoker, Hallau; Herbert Staubli, Kunten, all of Switzerland

[73] Assignee: Sieba AG, Urdorf, Switzerland

[21] Appl. No.: 194,503

[22] Filed: Feb. 9, 1994

[30] Foreign Application Priority Data

Feb. 10, 1993 [CH] Switzerland ............... 0407/93

[51] Int. Cl.⁶ .................................. H05K 7/20
[52] U.S. Cl. ........................ 324/760; 361/694; 73/865.6; 324/73.1
[58] Field of Search ............. 361/382, 694; 73/865.6; 324/158 F, 73.1, 760

[56] References Cited

U.S. PATENT DOCUMENTS

| | | |
|---|---|---|
| 4,729,246 | 3/1988 | Melgaard ............... 73/865.6 |
| 4,799,021 | 1/1989 | Cozzi . |
| 4,871,963 | 10/1989 | Cozzi . |
| 4,939,621 | 7/1990 | Galian et al. . |
| 5,014,000 | 5/1991 | Schlagheck ............ 324/158 F |

FOREIGN PATENT DOCUMENTS

| | | |
|---|---|---|
| 0254691 | 1/1988 | European Pat. Off. . |
| 0346166 | 12/1989 | European Pat. Off. . |
| 58-218667 | 12/1983 | Japan . |

OTHER PUBLICATIONS

Qualitat und Zuverlassigkeit technischer Systeme (Quality and Reliability of Technical Systems) by A. Birolini, Springer Verlag, Berlin 1991, Third Edition, pp. 268–280.
Patent Abstracts of Japan, vol. 8, No. 72 (P-265) (1509) of 4 Apr. 1984.
International Search Report and Annex (in German).

*Primary Examiner*—Kenneth A. Wieder
*Assistant Examiner*—Mark Wardas
*Attorney, Agent, or Firm*—Sandler, Greenblum & Bernstein

[57] ABSTRACT

Device for testing electrical modules. At least one container is provided which includes openings through each of which one module can be inserted into the container so that the opening can be closed in a substantially sealing manner, with the container having at least one entrance which is connectable with an exit of an aggregate which in turn is suitable for the release of a medium having a selectable temperature and/or humidity content. The device permits the function testing of the module while temperature gradients are being run or while further tests are in progress.

5 Claims, 2 Drawing Sheets

DEVICE FOR TESTING ELECTRICAL MODULES

CROSS REFERENCE TO RELATED APPLICATION

This application claims the priority of Swiss Application No. 00 407/93-3, filed Feb. 10 1993, the disclosure of which is incorporated herein by reference in its entirety.

BACKGROUND OF THE INVENTION

1. Field of the Invention

This invention pertains to testing system for and a device for testing electrical modules.

2. Discussion of the Background of the Invention and Material Information

A substantial contribution for the assurance of quality and reliability of complex technical systems is accomplished via suitable testing processes during the production phases thereof. For the testing of electrical circuit boards or modules the processes are used either singly or preferably reciprocally that are described in Qualität und Zuverlässigkeit technischer Systeme by A. Birolini, Springer Verlag, Berlin 1991, Third Edition, pages 268–280. During a pre-control phase the built-up modules are visually inspected and are electrically tested with reference to their basic properties. In addition, thermic cycling (for example from −20° C. to +80° C. with gradients of 10° C./min.), vibratory cycling as well as long initial break-in at a normal operating temperature, are initially provided. In order to detect hidden deficiencies and reliability problems in environmental and reliability testing, extreme temperatures, additional thermal cycling, vibrations, humidity and ESD testing are also initially provided. During the previously noted tests the supply voltage should preferably also be switchable. Electrical testing is also of basic importance which is accomplished via known devices either before or after the previously-described tests. For such testing, a system analyzer is initially provided which determines the correspondence of the working of the tested module with a predetermined nominal value or behavior.

In known testing devices, up to this time, cold, heat and humidity chambers were provided. Vibration testing was accomplished in a further device. The electrical testing of the utilized modules was thus rather costly. Such electrical testing was practically not possible during the treatment process. For the thermal testing, for example, long, tunnel-shaped ovens were utilized through which individual modules were transported via a conveyor belt. Naturally, within these tunnel-type ovens the modules were not accessible for electrical testing.

In addition, the space requirement for these chambers, tunnel ovens and conveyor belts was considerable, which, in addition to the high cost for the test devices also caused considerable expense for the required premises. Furthermore, the time requirement for the entire quality testing was very high, since the modules had to be moved and exchanged, each time, within the tunnel oven and between the chambers and the devices.

SUMMARY OF THE INVENTION

It is an object or goal of the present invention to produce an economical testing device with which a single or multiple quality tests can be quickly conducted.

This is accomplished via an apparatus for testing electrical modules comprising at least one container having a plurality of openings; the modules being insertable into the at least one container in such a manner, via the plurality of openings, so that the openings can be closed in a substantially sealing manner; the at least one container having at least one entrance; an aggregate having an exit, the exit being operatively connectable with the at least one entrance of the at least one container; and a medium having a selectable temperature and/or humidity content; said aggregate being adapted for the release of the medium into said at least one container.

In a further embodiment of this invention the entrance for the medium into the at least one container is located on the underside of the container and is connectable with the exit of the aggregate via a bellows.

Another embodiment of this invention includes means for conveying, the means for conveying being adapted for the movement of modules from a receiving station at least to one aggregate and to a releasing station. Preferably, the means for conveying takes the form of a carousel or a conveying band.

In yet a further embodiment of this invention the at least one module includes an optical transmitting device or electrical contacts, with the optical transmitting device or the electrical contacts being accessible, from the outside of the container after the insertion of the modules into the container, via a system analyzer.

In yet another embodiment of this invention the system analyzer, which is adapted to be coupled to the modules, is connected with the aggregate; and the process of the addition of humidity, cooling or heating is controllable in dependence upon values measured by the system analyzer.

An additional embodiment of this invention includes means for vibration, with the at least one container being adapted to be operatively connected therewith.

In a further additional embodiment of this invention the at least one container includes electrical contacts, the at least one container serving to supply at least a supply voltage to the modules contained in the at least one container.

The testing device of this invention, which requires minimal placement area and has low production costs, permits the utilization of differing testing methods, either sequential or concurrent, that is, which can be accomplished in a complementary manner. In addition, the testing method, or the corresponding process is easier to control, that is the opening and closing of the installation is accomplished very quickly. Areas of ice formation are substantially avoided. In addition, temperature profiles can be individually defined and exactly regulated. An additional, substantial, advantage resides in the simple and clear layout of the device of this invention since there is practically no wear and thus low susceptibility to trouble. This low susceptibility to trouble is further enhanced in that the functional test parts (bands, workpiece carriers, etc.) are not exposed to the temperature stress of the climate chambers. The contacts with the modules to be tested occurs at room temperature in a defined atmosphere. As a result, the contacts and the corresponding adapters are treated gently. The changeover of the devices for testing other modules can be achieved with low expenditures. The electrical testing device of this invention thus requires only minimal service and operator input.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components and wherein.

DETAILED DESCRIPTION OF THE PREFERRED EMBODIMENTS

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

Figure 1:
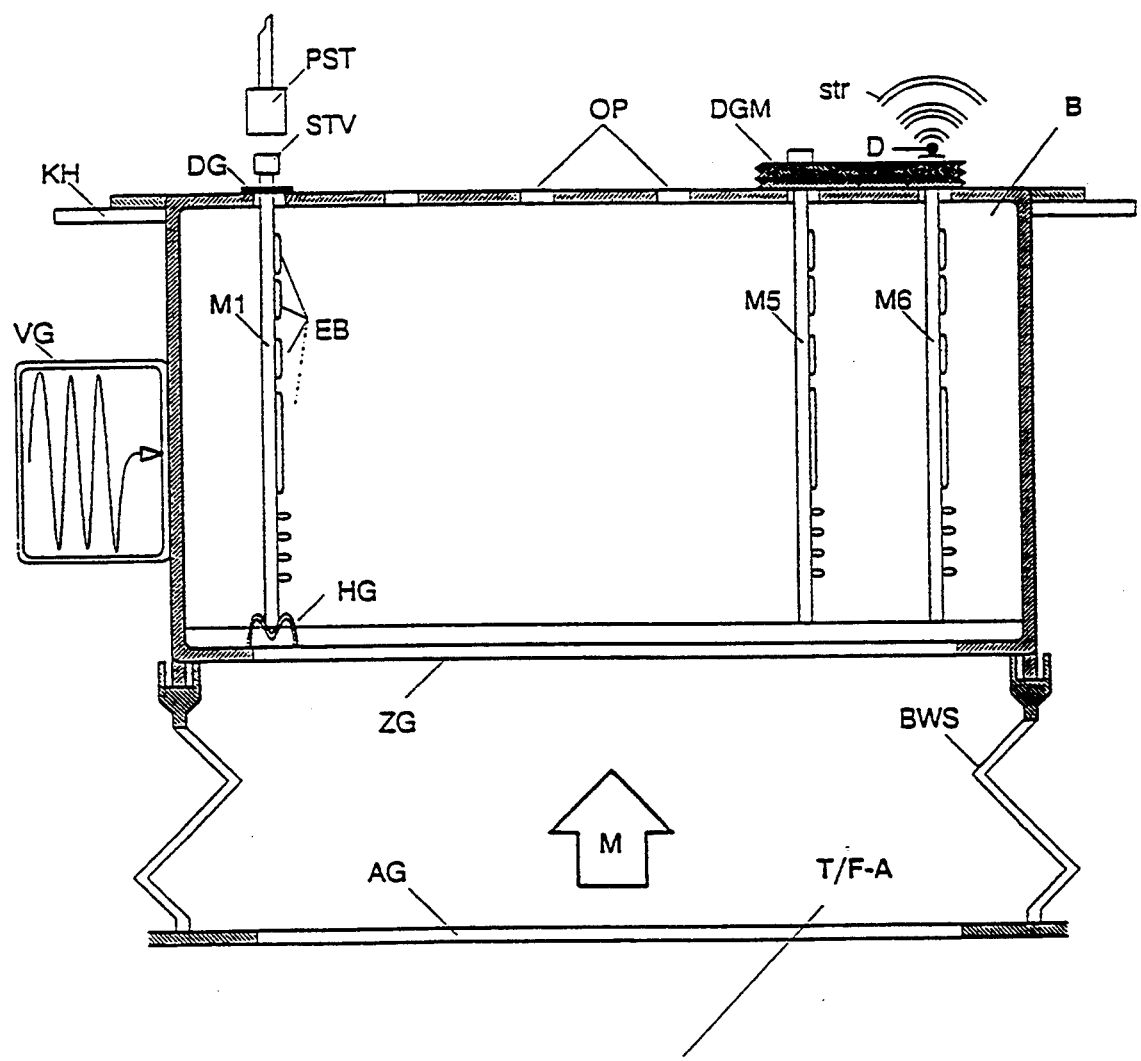
FIG. 1 shows a device for testing electrical modules according to the invention.

FIG. 1 shows a container B which is provided with six openings OP via which, for example, three circuit cards/boards or modules M1, M5 and M6, provided with electrical parts, are inserted into container B. Modules M are either suspended at the edges of openings OP or supported by a retainer HG at the floor of container B. In addition, rails, arranged at the container sides could also be utilized. The openings OP, via which modules M are inserted into container B, are preferable sealed via a small seal DG at the outer end of modules M or via a more extensive sealing mat DGM. The floor of container B is provided with a larger access or entrance 1G, which is provided for the supply or feeding a medium M that is received on an aggregate or unit T/F-A, with medium M having a selectable temperature and/or humidity content. Aggregate T/F-A, from which medium M emanates via the former's exit or opening AG, is connectable with container B via couplingly connectable bellows BWS. In addition, non-illustrated means are provided through medium M is channeled through container B into the surrounding area or back into aggregate T/F-A. Furthermore, container B is held via a holding device KH, which may be part of a conveyor band or part of a carousel KKL, shown in FIG. 2, which is provided for the transporting of container B. A vibratory device VG is also coupled or can be coupled to container B.

Module M1, which is received within the left side of container B, is provided on one side or end thereof with a connector STV or other similar contacts, via which a system analyzer (not shown) can be coupled with a plug or connector PST. Such a system analysis can occur simultaneously with the subject testing, i.e., during the running of temperature gradients, for example. In this manner it can be determined not only if a module M is defective, but also failures can be determined that occur only during certain conditions. The system analyzer can therefore directly intervene into the testing process in the instance when it is coupled with aggregate T/F-A. For this purpose, for example, temperature probes and other measuring probes can be provided on module M. Plug PST and connectors STV are located, as shown in FIG. 1, outside of container B and are thus nor exposed to the thermal and other loads. Container B preferably has a relatively small volume so that the desired temperatures can be set quickly and precisely. This behavior or property can additionally be enhanced if container B is constructed of robust and well insulated material. Via these measures, the already comparatively low emissions, from the subject device, to the environment can even be decreased further.

Container B can be easily retooled for use with other modules. For example, the cover of the container which includes openings OP can be removably mounted and preferably be operatively connected with the retainers HG of a specific module M. The retooling for use with other modules can thus be accomplished via the exchange of container B or only via the exchange of its cover. It is furthermore of importance that in the humidity chamber, that is in container B of FIG. 1, practically no parts of this device, except for the module M to be tested, are provided. Most of the parts of this testing device (coded workpiece carriers, driving and conveying means, etc.) are thus not exposed to the test conditions (temperature variations, etc.) and their service life expectancies are not compromised. Via the simple construction, as illustrated in FIG. 1, low production and maintenance costs are achieved.

Figure 2:
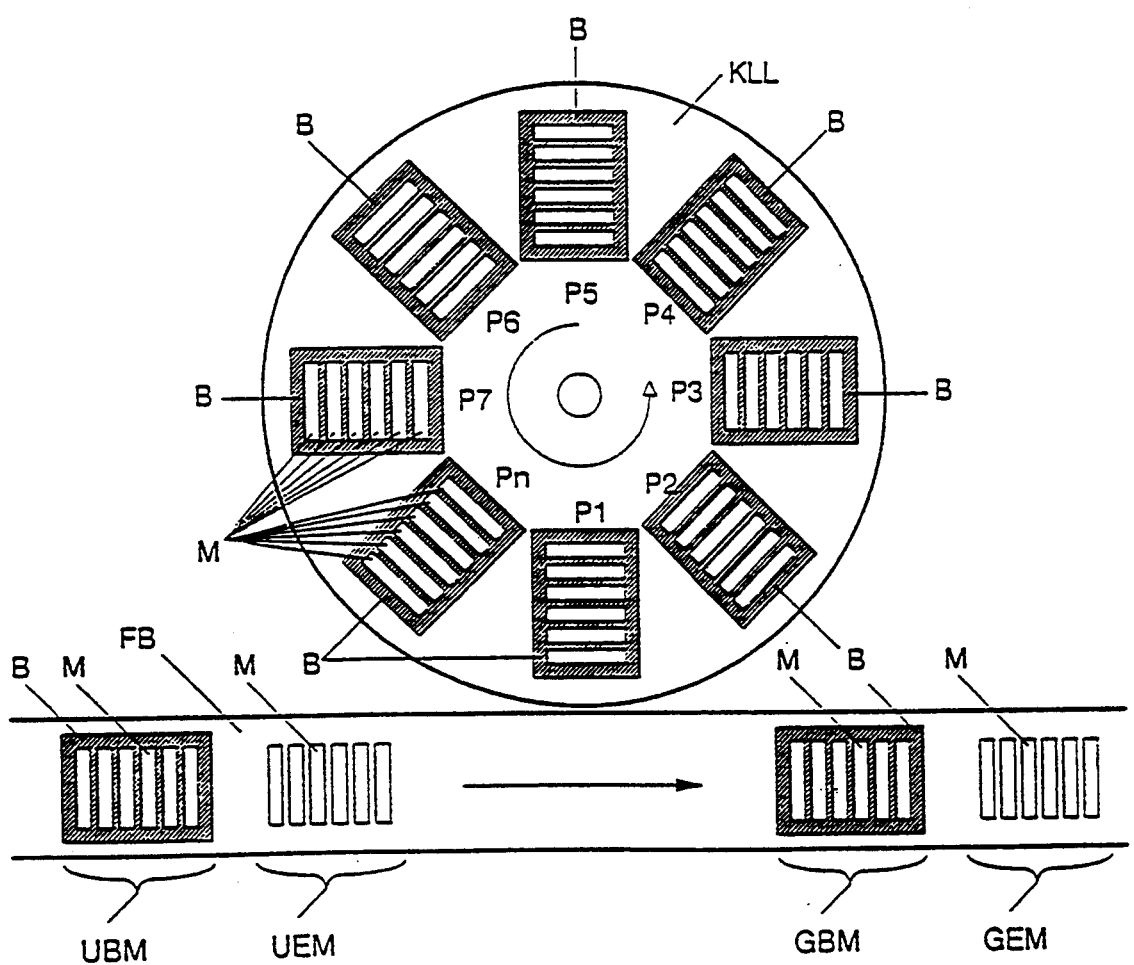
FIG. 2 shows a device for testing electrical modules, including a carousel, according to the invention.

FIG. 2 shows a carousel KLL which holds eight containers B provided with multiple modules M. Modules M are added singly or already in containers B via conveyor band FB and, after the testing process, are again removed singly or in containers B. Thus, for the loading of carousel KLL either the entire containers B are single modules M are exchanged. This is illustrated in FIG. 2, wherein conveyor band FB, which moves the direction of the arrow shown thereon, shows, from left to right, a single container UBM, of untested modules M, a plurality UEM of individual untested modules, a single container GBM of tested modules M and a plurality GEM of individual tested modules M.

The testing procedure occurs, for example, in the following manner: At position P1 of carousel KLL the modules are exchanged singly or in containers B. Thereafter, carousel KLL rotates 45 degrees, whereafter the subject container arrives at position P2. At this position, the bellows BWS of an aggregate T/F-A is upwardly directed and sealingly connected with the container, whereafter a medium M is introduced into the container or the container is connected with vibratory device VG, which may of any desired type. At position P2, for example, there can be an initial cooling and in the following position P3, ..., Pn, there can be additional cooling or heating and/or humidity can be added or removed. At individual positions P, a supply voltage can be switched on or off. In addition, at one ore more of the positions P, a test connector PST or the previously-noted optical sensor can be provided. As a result of this arrangement with carousel KLL, modules M can be tested quickly and thoroughly in a small space and a high density. A less favorable arrangement utilizes a conveyor band (such as for example conveyor band FB) for guiding the containers B toward aggregates T/F-A. However, even such a device can be favorably utilized if sufficient space is available.

In an additionally preferred embodiment of this invention, container B is provided with supply voltage leads, which extend singly to each of openings OP and are connected, via contacts, with modules M and a voltage supply source provided, for example on carousel KLL. Upon the insertion of the modules in container B and upon the insertion of container B into carousel KLL, a connection results with the preferably controllable voltage supply source. Thus, modules M can be subjected to thermal cycles or other test procedures in electrically switched-on or off states. Preferably, on the end of the module that extends from container B, a light diode D or other acoustic, electric or optical transmitting unit is provided, via which a processor, mounted on module M, can continuously provide status reports in regard thereto. Thus, in this manner it is possible to test all essential functions of a module M without having to electrically connect the system analyzer. This omits the electrical coupling devices and the associated contact problems. Only an optical sensor is required which transmits the signal emanating from the modules to the system analyzer. In addition, a test program is provided in module M which activates different electrical parts EB, via the processor, collects corresponding measurement signals and periodically disseminates status reports that include starting signals.

While there are shown and described present preferred embodiments of the invention, it is to be distinctly understood that the invention is not limited thereto, but may be otherwise variously embodied and practiced within the scope of the following claims and the reasonably equivalent structures thereto. Further, the invention illustratively disclosed herein may be practiced in the absence of any element which is not specifically disclosed herein.

What is claimed is:

1. An apparatus for testing electrical modules comprising:
   at least one movable container having a plurality of openings, said container being adapted to act as a thermal chamber;
   the modules being insertable into the at least one container in such a manner, via the plurality of openings, so that the openings can be closed in a substantially sealing manner;
   the at least one container having at least one entrance;
   an aggregate having an exit, the exit being operatively connectable with the at least one entrance of the at least one container;
   a medium having a selectable temperature and/or humidity content; said aggregate being adapted for the release of the medium into said at least one container; and
   means for conveying, the means for conveying being adapted for the movement of modules from a receiving station at least to one aggregate and to a releasing station.

2. The apparatus of claim 1 wherein the entrance for the medium into the at least one container is located on the underside of the container and is connectable with the exit of the aggregate via a bellows.

3. The apparatus of claim 1 wherein the means for conveying takes the form of one of a carousel and a conveying band.

4. An apparatus for testing electrical modules comprising:
   at least one container having a plurality of upper openings;
   the modules being insertable into the at least one container via the plurality of upper openings;
   a plurality of one of seals and sealing mats for closing the plurality of upper openings in a substantially sealing manner;
   the at least one container having a lower opening;
   an aggregate having an exit, the exit being connected with the lower opening of the at least one container;
   a releasable medium having a selectable temperature and/or humidity content, the aggregate carrying the medium and being adapted for the release of the medium; and
   the entrance for the medium being located at the lower opening of the container and being connected with the exit of the aggregate via a bellows.

5. The apparatus of claim 4 including means for conveying, the means for conveying being adapted for the movement of modules from a receiving station at least to one aggregate and to a releasing station, the means for conveying taking the form of one of a carousel and a conveying band.

* * * * *